United States Patent [19]

Baumgartner et al.

[11] Patent Number: 4,701,660
[45] Date of Patent: Oct. 20, 1987

[54] PIEZOELECTRIC TRANSDUCER FOR LOW FORCES

[75] Inventors: Hans-Ulrich Baumgartner, Winterthur; Reto Calderara; Hans-Conrad Sonderegger, both of Neftenbach, all of Switzerland

[73] Assignee: Kristal Instruments AG, Winterthur, Switzerland

[21] Appl. No.: 838,831

[22] Filed: Mar. 12, 1986

[30] Foreign Application Priority Data

Apr. 17, 1985 [CH] Switzerland ................ 01633/85

[51] Int. Cl.$^4$ ............................................ H01L 41/08
[52] U.S. Cl. .................................... 310/338; 73/774; 73/781; 177/210 R; 310/328
[58] Field of Search .................... 310/328, 329, 338; 73/760, 763, 765, 766, 774, 777, 781, 855, 700, 753, 754, 715, 717, 721, 723, DIG. 4, 517 R; 177/210 R

[56] References Cited

U.S. PATENT DOCUMENTS

| | | | |
|---|---|---|---|
| 2,216,966 | 10/1940 | Swift | 310/338 |
| 3,313,962 | 4/1967 | Sonderegger | 310/338 |
| 3,383,914 | 5/1968 | MacArthur | 310/338 X |
| 4,126,801 | 11/1978 | Corbett | 310/328 |
| 4,175,243 | 11/1979 | Corbett | 310/338 |
| 4,406,966 | 9/1983 | Paros | 310/338 X |
| 4,439,705 | 3/1984 | Corbett | 310/338 |

FOREIGN PATENT DOCUMENTS 3345750  6/1985  Fed. Rep. of Germany ...... 310/338

*Primary Examiner*—Mark O. Budd
*Attorney, Agent, or Firm*—Birch, Stewart, Kolasch & Birch

[57] ABSTRACT

The invention relates to a force transducer with at least 100 pC/N sensitivity. The piezo elements of this force transducer are connected rigidly to the force introducing elements, and therefore require no mechanical prestressing. A diaphragm may be provided and is then the only force shunt with a maximum proportion of 5%. The main force flow runs in these transducers through the piezo elements themselves, thereby keeping the pseudo-pyro effect, which is frequently brought about by mechanical shunting, within very narrow limits. Because of bottlenecks in the heat guide path to the piezo elements and the symmetrical construction of the supports, heat transients are also prevented from exerting an appreciable effect on the position of the zero point. This provides zero point stability, which allows accurate measurements in the 0 ... 1 N range, even where the ambient conditions are unfavorable from the point of view of temperature.

38 Claims, 8 Drawing Figures

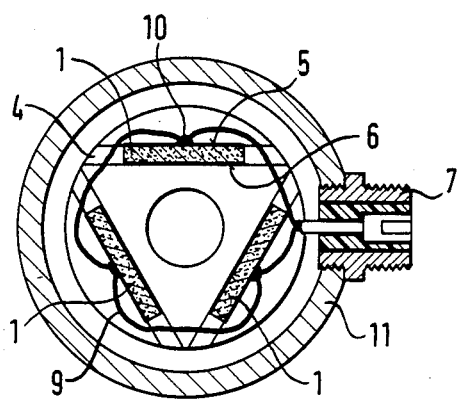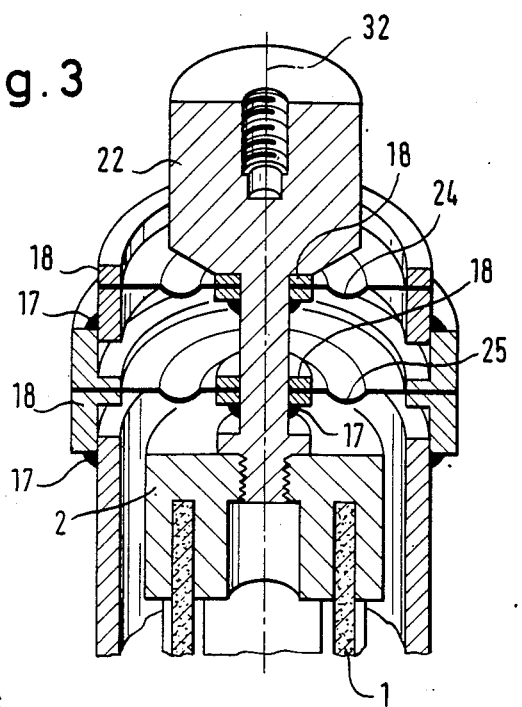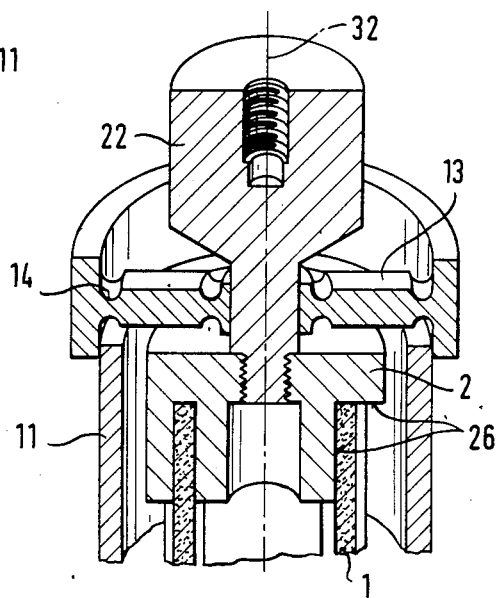

PIEZOELECTRIC TRANSDUCER FOR LOW FORCES

BACKGROUND OF THE INVENTION

1. Field of the Invention and Brief Description of Prior Art

The piezo effect has been known for over 100 years, and consists in the production of an electrical charge by a piezoelectrically active material, in most cases a crystal, under the influence of a force. This effect has been used for about 50 years to manufacture mechanical-electrical converters. Acceleration transducers and pressure transducers are very well known. Force transducers were not used more frequently until electronics had advanced sufficiently for the low piezoelectric charges to be stored for long periods of time without losses. However, acceleration and pressure transducers are effectively and essentially force transducers in which the pressure or acceleration signal is converted to a force signal. Since in the observation of acceleration processes and pressure processes the variations, i.e. the dynamics, of the measured value are of primary interest, the storage of the piezoelectric charges did not play such an important part in these measurements as in force measurements, where statics are extremely important. The advantages of the piezoelectric measuring method are the high sensitivity, good linearity, long-term constancy and low temperature dependence. There have therefore been many attempts to use this method for static, or at least for quasistatic, force measurements too. Within the framework of the state of the art, reference is made to the book "Piezoelektrische Messtechnik" (Piezoelectric metrology) by J. Tichy and G. Gautschi. A force transducer is explained in principle on page 150, FIG. 8.4., and two practical designs of force transducers are shown in a sectional view of page 155, FIG. 8.6. These are force transducers which make use of the longitudinal direct piezo effect. The piezo element is a quartz plate, with the force to be measured acting perpendicularly to the plane of the plate. Such force transducers operate satisfactorily as long as the force to be measured exceeds a value of one or two deca N. For measuring forces of 1N or less, the piezoelectric charge generated is so low that losses in the electronics and disturbances from outside influences may impair the measurements. Higher piezoelectric charges are obtained if the transversal piezoelectric effect is used. Under this effect the force does not act perpendicularly but parallel to the electrode planes. By using oblong plates or rods with a small cross-section, a piezo effect many times greater than the longitudinal effect can be achieved. In the book mentioned, at page 156, FIG. 8.7, a pressure transducer is shown which also serves as a force transducer based on the transverse piezoelectric effect. Higher sensitivities can also be obtained in force transducers due to the higher piezoelectric charges emitted by transducers with transverse effect.

In piezoelectric transducers, the introduction or application of the force creates a problem which must be carefully solved. Most piezoelectric materials, such as quartz, tourmaline or piezoceramics, are brittle. The force must therefore be applied uniformly over surfaces which are as large, and flat as possible, with low specific surface pressure, so that no point loads are applied to produce cracks. Stringent requirements must therefore be imposed on the flatness of the force introduction and electrode surfaces. For a particular force, the piezoelectrically emitted charge is not exactly the same in cases where it is introduced directly or over a large area, at the edge or in the centre of a piezo element.

The calibration factors of piezoelectric transducers of the same design therefore vary by a few percent. It has been shown to be appropriate to subject the piezoelectric elements in transducers to an initial compressive stress so that the effective area of contact of the force receiving elements and the electrodes with the piezo elements is as large as possible, and does not vary substantially when the measuring force varies. This also reduces the variation in calibration factors from one transducer to another. Many piezoelectric materials, e.g. quartz and tourmaline, are hydrophylic to a certain extent, i.e. the surfaces which should provide insulation are covered with a thin layer of water which impairs the insulation. It is therefore normal practice to pack such materials into a housing to keep atmospheric moisture from penetrating the insulating surfaces. However, this housing acts as a mechanical shunt for the measuring force, which diverts some of this force in parallel with the piezo element, thereby reducing the sensitivity of the transducer. An initial stress also has a positive effect on this shunt because a support located between force introduction surfaces and piezo elements with a small effective area of contact exhibits considerable interlaminar elasticity, which increases the efficiency of the shunt through the housing, and also gives rise to considerable nonlinearity. By applying an initial stress, the so-called "shrinkage" of the calibration curve can be avoided. This "shrinkage" means that in the case of low measured values, the beginning of the curve is much steeper than for higher measured loads. Another important advantage of initial stress is the increase in strength, which is already known from the behaviour of pre-stressed concrete. Like concrete, most piezoelectric materials share the property that their compressive strength is much greater (10 to 50 times) than their tensile strength. By superimposing an initial compressive stress, no tensile stress is generated in the case of an external additional load, e.g. during bending. Instead the initial compressive stress is reduced at individual points. The limits of the loads which may be applied externally are substantially widened as a result of this. A further important advantage of the initial stress lies in the fact that where the force is introduced positively, i.e. if plates are merely placed on top of each other, or rods are only installed between stops, tensile and shearing forces cannot be transmitted, or even measured at all, because of raising and sliding actions. The immobility or rigidity is required for introducing and transmitting eccentric, possibly inclined compresssive forces or bending moments, and is obtained initially indirectly as a result of the initial stress itself, and the frictional forces of the different parts against one another. Most piezoelectric transducers used today are therefore provided with a prestressing element for generating such an initial stress. In the case of the force transducers, FIG. 8.6, page 155, in the book quoted above, by Tichy and Gautschi, this element is the housing (3). The pressure transducer, FIG. 8.7, page 156, is also provided with a clamping sleeve (2). The accelerameter, FIG. 8.8, page 156, is also provided with a clamping sleeve (2). In the force transducer in FIG. 9.1, page 162, the housing (1) is again the prestressing element. Most acceleration transducers are also provided with prestressing elements, e.g. FIG. 11.9, page 205a, where the housing acts as the prestressing element. Variants b, c and d have a central bolt as the prestressing element.

There is no doubt that prestressing gives many advantages, but there are also disadvantages. One lies in the fact that in order to generate the initial stress, an element is required which should record only the force to be measured, but necessarily also exerts a mechanical force shunt to the piezo element. This shunt has a detrimental effect on the temperature stability of the transducer.

In the case of temperature variations, the shunt does not expand to exactly the same degree as or at the same time as the piezo element, which gives rise to a variation in the initial stress, which is in turn expressed in the form of a zero point drift. Even if the shunt is successfully manufactured from material with exactly the same coefficient of expansion as the piezo element, there may nevertheless be differences in expansion in the case of inhomogeneous temperature distribution. This zero point shift due to temperature variation is called the pseudyo-pyro effect. By contrast, the real pyro effect is a well known phenomenon which is exhibited by certain piezoelectric materials, e.g. tourmaline or piezo ceramics, where the material itself generates a charge when the temperature varies. In most cases this effect is so great that absolutely no sensitive measurements are possible with such materials because the slightest temperature variations cause an excessive shift in the zero point. However, there are classes of piezo electric crystals, e.g. quartz, which have no pyro effect. A loose piezo element of such a material does not produce a charge when subjected to homogeneous heating. The situation is different, however, if the heating is applied locally, irregularly or as a temperature shock, and internal stresses are exerted. These internal stresses should not actually generate charges, if the piezo effect were to be the same at all points, because charges of both signs, which should compensate each other externally, are generated due to the enclosed nature of the non-positive force. But since the internal central sections of a piezo element are less piezoelectric than sections close to the surface of the material, because of the suppression of the Poisson effect, the compensation is not complete, with the result that residual charges may also be generated due to internal stresses. Moreover, it is very important how the electrodes are distributed, and whether they are able to record the charges generated or not. For example, it might be the case that tensile stresses are produced in the vicinity of an electrode, and that no electrode is present close to points where the corresponding compressive stresses are exerted, with the result that only the tensile stresses are recorded.

BRIEF SUMMARY OF THE INVENTION

It is accordingly an object of the invention to provide a force transducer which is particularly suitable for measuring low tensile and compressive forces.

A further object of the invention is to provide a force transducer which on the one hand generates sufficiently high electrical charges, which in turn generate a sufficiently large signal in a connected charge amplifier, compared with the amplifier noise, and which on the other hand is provided with sufficient zero point stability for even quasi-static force processes to be recorded.

A further object of the invention is to provide a force transducer wherein the pyro effect, including the relatively weak quasi-pyro effect, is avoided.

A further object of the invention is to provide a transducer with an advantageous piezoelectric material.

A further object of the invention is to provide a force transducer where the transversal effect is used to advantage, to generate a high charge signal, and where the elements are designed to obtain a high multiplication factor of the piezo effect.

A further object of the invention is to provide a force transducer wherein the mechanical force shunt is minimised, or even eliminated altogether.

A further object of the invention is to provide a force transducer having piezoelectric elements secured to force transmission or introduction elements and measuring electrodes designed so that the piezoelectric forces which are generated by the clamping forces do not reach the measuring electrodes.

Yet a further object of the invention is to provide a force transducer wherein the force is introduced to the piezo elements as free from moments as possible, so that uniaxial, homogeneous stress conditions are created in the piezo elements parallel with the axis of the transducer.

The invention accordingly provides a piezoelectric force transducer having a plurality of piezo elements of elongate or rod-like form and of material free from pyro effects, the piezo elements acting by a transverse piezo effect and extending between force-receiving members to which they are connected in a direct, rigid manner, whereby tensile and compressive forces can be transmitted to the piezo elements without prestress and without shunting of the forces in excess of 5% in the longitudinal direction.

As the piezo elements must be of material free from pyro-effects, preference is given to crystalline quartz, but also to other materials such as potassium phosphate, KH2PO4, or ammonium phosphate, NH4H2PO4.

BRIEF DESCRIPTION OF THE DRAWINGS

Further objects and advantages will be evident from the following illustrative description of preferred piezoelectric force transducers in accordance with the invention, and from the accompanying drawings, in which:

FIG. 2 shows a central transverse section through the transducer of FIG. 1;

FIG. 3 shows in longitudinal section an advantageous modified design of a diaphragm portion of the transducer, with a double diaphragm;

FIG. 4 is a like view of a parallel guidance arrangement for a force introduction element of the transducer, with articulated levers;

As shown in FIG. 1, rods which may be of any shaped cross-section, but advantageously rectangular, are provided as piezo elements 1. In the case of quartz, the longitudinal axis of the rods is parallel with the Y-axis, the transverse expansion is parallel with the Z-axis, and the expansion in the direction of the thickness of the rods is parallel with the X-axis. At the ends, the piezo elements 1 are rigidly secured in supports 2 and 3.

In principle, any number of piezo elements 1 can be used, even only one. However, since the buckling stability of a single element is very low, at least three elements are advantageously used, which together generate a considerable surface moment of inertia in relation to both transverse axes of the transducer, thereby providing high buckling strength of the prismatic structure. The piezo elements 1 can be clamped, glued or soldered in grooves 4 in the supports 2 and 3.

If there is no requirement for measuring higher forces in the region of 100N, a simple stop or abutment 26 will suffice (see FIG. 4). The cross-sections of the piezo elements are suitably rectangular so that they fit snugly into the grooves to provide an adequate surface of adhesion.

Figure 1:
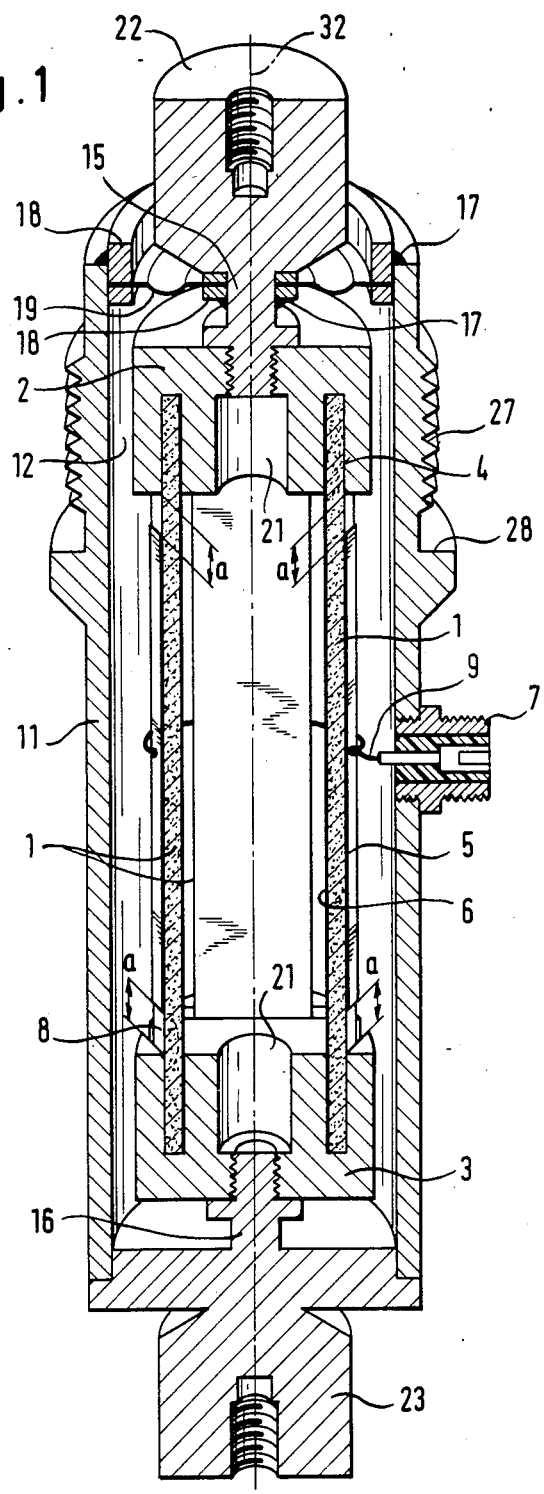
FIG. 1 shows a longitudinal sectional view of a transducer embodying the invention.

The screw devices shown in FIG. 1 will then be necessary for clamping. Hot setting cement, which has proved satisfactory in the past, is best used for adhesion, or premetallising of the element ends is required for soldering so that the solder adheres. The piezo elements 1 are provided with metallising as the electrode, on the surface perpendicular to the piezoelectric axis (in the case of quartz the X-axis). Metallising serves as electrode 5 for reducing the piezoelectric charges, and the opposite metallising is the earth electrode 6. If the connection plug 7 is located on the side of the housing, charge reducing electrodes 5 are suitably located on the outer periphery of the piezo element package, and if the plug is located in the axis of the transducer, the charge reducing electrode 5 is suitably located on the inside of the piezo element package. The metallising of the charge reducing electrode 6 does not extend quite as far as the supports 2 and 3, but stops at a certain distance, a, from the supports, so that an insulation section 8 of length a is produced between the electrode and the support, which are located on the earth potential. In this case a should be at least equal to the thickness of the piezo elements. Inhomogeneities of the stress distribution are produced as a result of securing the piezo elements 1 in the supports 2 and 3, and extend from the supports a certain distance into the piezo elements 1, which should not be used for application of the piezo signal. The insulation section 8 is therefore not only an electrical insulation section, but also a mechanical one which is intended to keep the stress inhomogeneities away from the measuring range of the piezo elements 1. Moreover, piezo electric charges which could generate charges in the measuring electrodes 5, through influence, are produced in the support by the internal forces. This influence can also be reduced by the insulation section. It is obviously an advantage if this insulation area 8 is made larger than only one rod thickness, but this is at the expense of the sensitivity of the recorder. The piezoelectric charges are reduced by means of a fine resilient wire 9 of the electrodes 5, and are guided to the plug 7, so that no mechanical influences on the piezo element are initiated. The wire is secured to the conducting adhesive point 10. The metallisation of the earth electrode 6 extends as far as the support 2 and 3, and is electrically connected to it.

The arrangement of piezoelectric elements 1 and supports 2 and 3 is actually sufficient to act as a force transducer. The best results, as far as zero point drift and sensitivity are concerned, are obtained with such a simple arrangement if the force is introduced and discharged accurately along the axis of the piezo element package. However, the sensitive piezo element package should suitably be installed in a housing 11 which protects it against contamination and undesirable contact. The gap 12 between the support 2 and housing 11 may be made so small that a lateral force exerted on the connection nipple 22 or support 2 brings the latter in contact with the housing 11 before the piezo element package breaks. In this case the housing acts not only as a contact protection, but also as an overload protection. Of course the inside of the housing is then still in contact with the atmosphere, and air moisture or dust can be precipitated on the piezo elements, impairing the insulation. However, there are possibilities of rendering the surfaces of the piezo elements hydrophobic, which at least prevents a reduction in the insulation through water precipitation. Such non-diaphragm transducers can only be used in a clean environment. It is therefore appropriate to seal the housing 11, in the vicinity of the support 2, by means of a diaphragm 19. This prevents the admission of air, but it makes the force transducer sensitive to a variation in the ambient pressure. Similarly, heating the transducer by increasing the internal pressure of the enclosed gas gives rise to tensile stress, which shifts the zero point. The latter can be prevented by evacuating the interior, but the diaphragm 19 must then be designed fairly robustly, which means that a real mechanical force shunt is again incorporated. Not much space is provided for the diaphragm 19 in any case, and because of this, as has been shown in practice, it is in most cases impossible to design the diaphragm with more than one annular corrugation. This corrugation is sufficient, however, to produce a mechanical shunt through the diaphragm to be below 5%, in most cases, compared with the rigidity of the piezo element package, thereby reducing the pseudo-pyro effect and the zero point drift to such an extent that highly sensitive measurements can actually also be carried out in the quasistatic range.

A double diaphragm should preferably be used, such as that shown in FIG. 3. Diaphragms 24 and 25 together provide parallel guidance for the support 2, and prevent a bending moment from being transmitted to the support. This moment can be introduced from outside from the nipple 22 onto the support 2, or a bending moment may also act on the support, through a transverse force exerted on the nipple 22, if only one diaphragm is provided. This parallel guidance need not necessarily be provided by diaphragms 19,24,25, but there are simple lever systems provided by elastically supported beams 13, with articulated areas 14 with which such a guide, similar to diaphragm 19, or system 24 and 25, could be obtained. The diaphragms have the additional advantage, of course, that they are able to absorb a moment of rotation along the recorder axis, applied from outside to the nipple 22 and support 2, and to support it on the housing, so that the piezo elements are spaced such moment of rotation. Apart from the fact that the piezo element package is not very torsionally rigid, such a moment is still a major disadvantage when using quartz, because the moment produces a direct piezoelectric charge, via the piezo modulo d14 of the quartz, thereby falsifying the results of the longitudinal force measurement.

The installation of the diaphragms 19,24 or 25 also causes problems. If they are simply welded to the housing and to the support 2, they are very seriously distorted by thermal expansions, and give rise to a certain amount of deflection and prestressing, after cooling, both in themselves and in the piezo elements 1. To avoid this it is an advantage first to weld or hard solder the diaphragms in the welding ring 18, then weld the welding rings 18, with the housing 11 and support 2, in a second process during which the diaphragm must be cooled. The diaphragms may then be secured without additional prestressing, and therefore remain fully stress relieved and elastic, and effect a very small mechanical shunt. A further advantageous structural measure is drastically to reduce the cross-section 15 and 16 on the supports 2 and 3 between the actual outer force introduction sections of the connection nipples 22 and 2 and the piezo element clamping points 2 and 3 inside. This cross-section reduction 15 and 16 prove advantageous in two respects. Because of the increased bending elasticity, it is possible to adapt the piezo element package to the nipples 22 and 23, particularly if the lines of action of the incident forces do not lie exactly flush together. This prevents large bending moments from being generated. However, the reduction in cross-section is still advantageous from the heating point of view if the nipples 22 and 23, due to use in certain circumstances, are exposed to high temperatures, thereby reducing the amount of heat penetrating the actual support of the piezo elements 2 and 3, and also channelling it so that the heat distribution is similar for both supports 2 and 3, provided that the dimensioning of the support 2 and 3 is very similar. Many disturbances through thermal stresses cancel each other out. The exact representation of all the possible thermal stress errors which might occur, and the compensation which could be obtained, are so comprehensive that they cannot be described within the framework of one specification. Nor have the facts relating to this possibility of compensation been found theoretically, but rather through experimental investigations. It has also been found experimentally that a hole 21 increases the elasticity of the support 2 relative to the element clamping, thereby reducing the thermal stress. It is also an advantage, if diaphragms are already being used, to fill the inside with a highly conductive gas, such as hydrogen or helium, in order to reduce the temperature inhomogeneities through improved heat exchange, and diminish the thermal stresses.

Figure 5A:
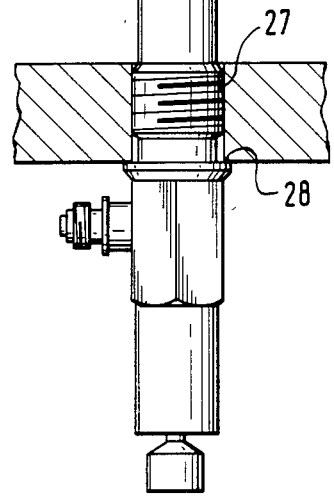
FIG. 5a shows a rigid, threaded installation on the housing for mounting the transducer.
Figure 5B:
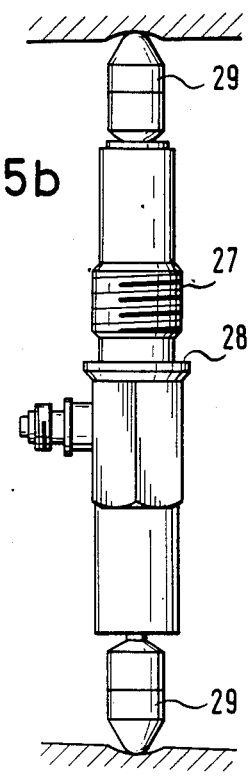
FIG. 5b shows a movable installation for mounting the transducer, for compressive forces.
Figure 5C:
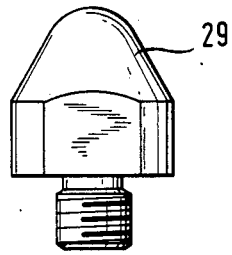
FIG. 5c shows a spherical attachment for an installation according to FIG. 5b.
Figure 5D:
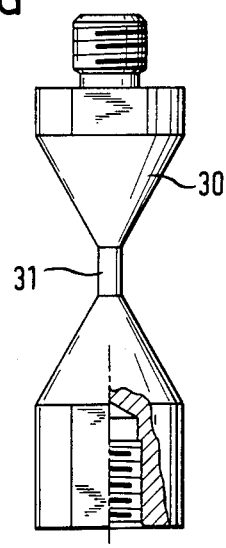
FIG. 5d shows a coupling element for a movable installation, but suitable for both tensile and compressive force measurement.

Since moment-free force introduction is extremely important for satisfactory operation of a transducer, the transducer must be installed very carefully. If the expected forces are constant and known, with regard to position and direction, it is possible to justify choosing a rigid installation, as shown in FIG. 5a. The transducer is screwed to a suitable support by means of the thread 27 and stop 28, in which case the threaded hole must be arranged so that the measuring force acting on the transducer runs through the transducer axis 32. Such a rigid installation, if correctly carried out, presents no problems, and need not be periodically checked. Instead of the thread 27 and stop 28, connection nipples may also be used for a rigid installation (not shown). If constancy is not provided, or the position of the line of action is not known, a movable installation, as shown in FIGS. 5b and 5c, with spherical attachments 29 is required. This installation ensures that the transducer axis is aligned with the line of action, and presupposes that the connecting plug 7 is fitted on the side of the housing 11, since the ball heads 29 rest on the transducer axis 32. The ball heads 29 are only suitable for transmitting compressive forces. If tensile forces are also to be transmitted, coupling elements 30, see FIG. 5d, with a flexible narrow point 31, must be used to guarantee adaptation to axial direction both for compressive and tensile forces.

We claim:

1. A piezoelectric force transducer comprising
   at least one elongate piezo element, said piezo element being of piezo material free from pyro effects and acting by means of a transverse piezo effect,
   a force-introducing member at each end of said piezo element, and
   recesses in said members for receiving said at least one piezo element, said at least one piezo element being connected directly and rigidly to said members whereby tensile or compressive forces can be transmitted to said piezo element without mechanical prestress and whereby the force in shunt to said at least one piezo element is less than 5% in the longitudinal direction.

2. The piezoelectric force transducer of claim 1 wherein three of said piezo elements are provided.

3. The piezoelectric force transducer of claim 1 wherein abutments or in stops are provided in said force introducing elements for receiving said piezo elements.

4. The piezoelectric force transducer of claim 1 wherein said at least one piezo element is rectangular in cross-section.

5. The piezoelectric force transducer of claim 1 wherein said force introducing elements are of substantially similar dimensions.

6. The piezoelectric force transducer of claim 1 wherein said at least one piezo element is glued to said force-introducing elements.

7. The piezoelectric force transducer of claim 1 wherein said at least one piezo element is clamped to said force introducing elements.

8. The piezoelectric force transducer of claim 1 wherein said at least one piezo element is soldered to said force introducing elements.

9. The piezoelectric force transducer of claim 1 wherein said at least one piezo element is secured to said force introducing elements by diffusion welding.

10. The piezoelectric force transducer of claim 1 wherein said at least one piezo element carries metallisation electrically connected to said force introducing elements to serve as a ground electrode.

11. The piezoelectric force transducer of claim 1 wherein said at least one piezo element is provided externally with metallization serving as an electrode and spaced from said force introducing elements by at least the thickness of said piezo element, and further comprising a connection terminal and a fine wire, said fine wire connecting said metallization to said terminal.

12. The piezoelectric force transducer of claim 1 wherein said at least one piezo element consists of quartz crystal.

13. The piezoelectric force transducer of claim 1 wherein said at least one piezo element consists of potassium sulphate crystal (KH2PO4).

14. The piezoelectric force transducer of claim 1 wherein said at least one piezo element consists of ammonium phosphate crystal (NH4H2PO4).

15. The piezoelectric force transducer of claim 1 further comprising a tubular housing having said at least one piezo element received therein, and a flexible diaphragm, said housing being connected at one end to one of said force introducing elements and at the other end thereof to said other of said force introducing elements by means of said diaphragm, and wherein said tubular housing, said diaphragm and said elements define a closed cavity.

16. The piezoelectric force transducer of claim 15 wherein said cavity is evacuated.

17. The piezoelectric force transducer of claim 15 wherein said cavity is filled with a gas with good thermal conduction.

18. The piezoelectric force transducer of claim 15 wherein said housing is manufactured from a material of which the coefficient of thermal expansion largely corresponds to that of said at least one piezo element.

19. The piezoelectric force recorder of claim 15 wherein said diaphragm is corrugated.

20. The piezoelectric force transducer of claim 15 further comprising a second guiding element in addition to said diaphragm for absorbing external moments.

21. The piezoelectric force transducer of claim 20 wherein said second guiding element is a diaphragm.

22. The piezoelectric force transducer of claim 15 wherein said diaphragm is fitted and welded so as to be largely free of initial stress by means of an additional soldering ring.

23. The piezoelectric force transducer of claim 15 further comprising a nipple connected to each of said force-introducing elements, and wherein a gap is provided between one of said force introducing elements and said housing, which gap is so dimensioned that said element, under a lateral force exerted on the nipple connected thereto, engages said housing to thereby prevent breakage of said at least one piezo element.

24. The piezoelectric force transducer of claim 23 wherein each of said force introducing elements is connected to the associated nipple at a region of substantial reduction in cross-section.

25. The piezoelectric force transducer of claim 15 wherein said housing is provided with a thread and a stop for rigid installation of the recorder.

26. The piezoelectric force transducer of claim 15 further comprising a connecting terminal secured to the side of said housing.

27. The piezoelectric force transducer of claim 1 further comprising two coupling elements each with a narrow resilient portion, between which said transducer may be installed.

28. The piezoelectric force transducer of claim 1 further comprising two part spherical attachments between which said transducer may be supported.

29. A piezoelectric force transducer comprising
at least one rod-shaped piezo element of rectangular cross-section, said piezo element being of piezo material free from pyro effects and acting by means of a transverse piezo effect,
two force-introducing members, and
abutment means formed on said force introducing members, said piezo element having each end thereof connected directly and rigidly to a respective one of said force-introducing members at said abutment means, whereby tensile or compressive forces can be transmitted to said piezo element without mechanical prestress and whereby the force in shunt to said piezo element is less than 5% in the longitudinal direction.

30. A piezoelectric force transducer comprising:
a tubular housing,
a first force transmitting member connected to one end of said housing having recesses formed therein,
a second force transmitting member, having recesses formed therein,
flexible diaphragm means, said second force transmitting member being connected to the other end of said housing through said diaphragm means, said housing, said first and second force transmitting means and said diaphragm means defining a sealed chamber,
a plurality of elongate piezo elements of material free from pyro effects and acting by transverse piezo effect, said piezo elements having the ends thereof received in said recesses of said force transmitting elements so as to extend therebetween and being connected to said force transmitting members for transmission of a tensile or compressive force to said piezo elements without mechanical prestress and with less than 5% of the force in the longitudinal direction in shunt with said piezo elements.

31. A piezoelectric force transducer comprising:
a tubular housing,
a first force transmitting member connected to one end of said housing, and having abutment means formed therein,
a second force transmitting member having abutment means formed therein,
flexible diaphragm means, said second force transmitting member being connected to the other end of said housing through said diaphragm means, said housing, said first and second force transmitting means and said diaphragm means defining a sealed chamber,
a plurality of rod-shaped piezo elements of material free from pyro effects and capable of operation by transverse piezo effect, said piezo elements extending between said abutment means of said first and said free transmitting member and being connected to said force transmitting members for transmission of a tensile or compressive force to said piezo elements without mechanical prestress and with less than 5% of the force in the longitudinal direction in shunt with said piezo element.

32. A piezo electric force recorder comprising:
a tubular housing,
a first force transmitting member connected to one end of said housing,
a second force transmitting member,
flexible diaphragm means, said second force transmitting member being connected to the other end of said housing through said diaphragm means, said housing, said first and second force transmitting means and said diaphragm means defining a sealed chamber,
a plurality of rod-shaped piezo elements adapted to act by transverse piezo effect and made of material free from pyro effects, said piezo elements being of rectangular cross-section and extending between said first and said force transmitting members and being connected to said force transmitting members for transmission of a tensile or compressive force to said piezo elements without mechanical prestress and with less than 5% of the force in the longitudinal direction in shunt with said piezo elements.

33. A piezoelectric force transducer comprising
at least one rod-like piezo element of rectangular cross-section, said piezo element being of piezo material free from pyro effects and acting by means of a transverse piezo effect,
a force-receiving support at each end of said piezo element, means connecting said piezo element directly and rigidly to said supports whereby tensile or compressive forces can be transmitted to said piezo element without mechanical prestress and whereby the force in shunt with said piezo element is less than 5% in the longitudinal direction, and housing means connected to said supports and containing said at least one piezo element, said housing means having a thermal coefficient at least approximating to that of said piezo element.

34. A piezoelectric force transducer comprising:
a tubular housing,
a first force transmitting member connected to one end of said housing,
a flexible corrugated diaphragm
a second force transmitting member, said second force transmitting member being connected to the other end of said housing by means of said diaphragm, said housing, said first and second force transmitting means and said diaphragm defining a sealed chamber, and
a plurality of elongate piezo elements of material free from pyro effects and adapted for operation by transverse piezo effect, said piezo elements extending between said first and said free transmitting members and being connected to said force transmitting members for transmission of a tensile or compressive force to said piezo elements without mechanical prestress and with less than 5% of the force in the longitudinal direction in shunt with said piezo elements.

35. A piezoelectric force transducer comprising:
a tubular housing,
a first force transmitting member connected to one end of said housing,
a second force transmitting member,
a flexible diaphragm,
a guide element,
said second force transmitting member being connected to the other end of said housing by said diaphragm and said guide element so as to resist externally applied bending moments, and
at least one elongate piezo element operating by transverse piezo effect and consisting of material free from pyro effects, said piezo element extending between said first and said free transmitting member and being connected to said force transmitting members for transmission of a tensile or compressive force to said piezo element without mechanical prestress and with less than 5% of said force in the longitudinal direction being in shunt with said piezo element.

36. A piezoelectric force transducer comprising:
a tubular housing,
a first force transmitting member connected to one end of said housing,
at least one flexible diaphragm,
a second force transmitting member,
solder ring means whereby said second force transmitting member is connected to the other end of said housing by said at least one diaphragm substantially without initial stressing of said at least one diaphragm, said housing, said first and second force transmitting means and said at least one diaphragm defining a sealed chamber,
a plurality of elongate piezo elements adapted to act by transverse piezo effect and made of material free from pyro effects, said piezo elements extending between said first and said force transmitting members and being connected thereto for the transmission of a tensile or compressive force to said piezo elements without mechanical prestress and with less than 5% of the force in the longitudinal direction in shunt with said piezo elements.

37. A piezoelectric force transducer comprising:
a tubular housing,
a first force transmitting member connected to one end of said housing,
a corrugated flexible diaphragm,
a second force transmitting member,
an inner solder ring on said second force transmitting member,
an outer solder ring within and at the other end of said housing, said diaphragm being fitted to said first and second solder rings substantially without initial stress to thereby connect said second force transmitting member to said housing, and
a plurality of elongate piezo elements of material free from pyro effects and such as to operate by transverse piezo effect, said piezo elements extending between said first and said force transmitting members and being connected thereto for transmission of a tensile or compressive force to said piezo elements without mechanical prestress and with less than 5% of the force in the longitudinal direction in shunt with said piezo elements.

38. A piezoelectric force transducer comprising:
a tubular housing,
a first force transmitting member connected to one end of said housing,
a second force transmitting member,
first and second flexible diaphragms,
solder ring means connecting said first and second diaphragms without substantial initial stress so as to extend between said second force transmitting member and the other end of said housing, and
elongate piezo elements of material free from pyro effects and adapted for operation by transverse piezo effect, said piezo elements extending between said first and said force transmitting member and being connected to said force transmitting members for transmission of a tensile or compressive force to said piezo elements without mechanical prestress and with less than 5% of the force in the longitudinal direction in shunt with said piezo elements.

* * * * *